(12) United States Patent
Park

(10) Patent No.: US 9,276,234 B2
(45) Date of Patent: Mar. 1, 2016

(54) METHOD OF PREPARING ORGANIC LIGHT EMITTING DEVICE

(75) Inventor: Jin-Woo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 698 days.

(21) Appl. No.: 13/607,311

(22) Filed: Sep. 7, 2012

(65) Prior Publication Data

US 2013/0230664 A1 Sep. 5, 2013

(30) Foreign Application Priority Data

Mar. 2, 2012 (KR) .......................... 10-2012-0022041

(51) Int. Cl.
*C23C 14/00* (2006.01)
*C23C 18/00* (2006.01)
*H01L 51/52* (2006.01)

(52) U.S. Cl.
CPC .................................. *H01L 51/5253* (2013.01)

(58) Field of Classification Search
CPC .................................................. H01L 51/5253
See application file for complete search history.

(56) References Cited

U.S. PATENT DOCUMENTS

| | | | |
|---|---|---|---|
| 7,829,147 B2 | 11/2010 | Aitken et al. | |
| 2004/0195960 A1* | 10/2004 | Czeremuszkin et al. | 313/504 |
| 2004/0251827 A1* | 12/2004 | Kang et al. | 313/512 |
| 2005/0285510 A1 | 12/2005 | Han et al. | |
| 2006/0078677 A1* | 4/2006 | Won et al. | 427/248.1 |
| 2007/0252526 A1 | 11/2007 | Aitken et al. | |
| 2008/0305360 A1 | 12/2008 | Han et al. | |
| 2009/0021157 A1* | 1/2009 | Kim et al. | 313/504 |
| 2009/0191355 A1* | 7/2009 | Lee et al. | 427/535 |

(Continued)

FOREIGN PATENT DOCUMENTS

| | | |
|---|---|---|
| EP | 1 925 444 A1 | 5/2008 |
| EP | 1 965 453 A2 | 9/2008 |

(Continued)

OTHER PUBLICATIONS

Engineering Toolbox. Air Composition. Mar. 30, 2015. Engineering Toolbox. Table 1.*

(Continued)

*Primary Examiner* — Dah-Wei D Yuan
*Assistant Examiner* — Kristen A Dagenais
(74) *Attorney, Agent, or Firm* — Lewis Roca Rothgerber Christie, LLP

(57) ABSTRACT

A method of preparing an organic light-emitting device includes forming an organic emission unit on a substrate, and forming a thin film encapsulation layer that contacts an environmental element, and that includes at least one inorganic layer including a low temperature viscosity transition (LVT) inorganic material, wherein the inorganic layer is formed using a process including forming a pre-inorganic layer including the LVT inorganic material by providing the LVT inorganic material onto the organic emission unit on which the environmental element is located, performing a first healing process on the pre-inorganic layer at a temperature greater than a viscosity transition temperature of the LVT inorganic material, and performing a second healing process on the pre-inorganic layer having undergone the first healing process to increase a binding force between the environmental element and the LVT inorganic material, and to increase a binding force among the LVT inorganic material.

2 Claims, 6 Drawing Sheets

(56) References Cited

U.S. PATENT DOCUMENTS

2011/0140164 A1 6/2011 Seo et al.
2011/0260147 A1 10/2011 Kim et al.

FOREIGN PATENT DOCUMENTS

| JP | 2010-532070 | | 9/2010 |
|---|---|---|---|
| KR | 10-2006-0067504 | A | 6/2006 |
| KR | 10-2008-0107220 | | 12/2008 |
| KR | 10-0926030 | B1 | 11/2009 |
| KR | 10-2010-0050470 | | 5/2010 |
| KR | 10-2011-0067411 | | 6/2011 |
| WO | WO 2007/021627 | A1 | 2/2007 |
| WO | WO 2007021627 | A1 * | 2/2007 |

OTHER PUBLICATIONS

EPO Search Report dated Jun. 3, 2013, for corresponding European Patent application 13157490.7, (8 pages).

KIPO Notice of Allowance dated Sep. 27, 2013, for Korean priority Patent application 10-2012-0022041, (2 pages).

* cited by examiner

METHOD OF PREPARING ORGANIC LIGHT EMITTING DEVICE

CROSS-REFERENCE TO RELATED PATENT APPLICATION

This application claims priority to and the benefit of Korean Patent Application No. 10-2012-0022041, filed on Mar. 2, 2012, in the Korean Intellectual Property Office, the disclosure of which is incorporated herein in its entirety by reference.

BACKGROUND

1. Field

Embodiments of the present invention relate to a method of preparing an organic light-emitting device.

2. Description of the Related Art

Organic light-emitting devices, which are self-emitting devices that can provide multicolored images, have advantages such as a wide viewing angle, excellent contrast, quick response, increased brightness, and excellent driving voltage characteristics.

Organic light-emitting devices include an organic emission unit including a first electrode, an organic layer, and a second electrode. Since the organic emission unit is vulnerable to elements in the external environment such as, for example, oxygen and moisture, a sealing structure that seals the organic emission unit from the external environment is required.

Furthermore, there is still a desire to develop a thin organic light-emitting device and/or a flexible organic light-emitting device.

SUMMARY

Embodiments of the present invention provide a method of preparing an organic light-emitting device including a thin film encapsulation layer having characteristics of excellent sealing from the external environment and flexibility for an extended period of time.

According to an aspect of the present invention, there is provided a method of preparing an organic light-emitting device, the method including forming an organic emission unit on a substrate, and forming a thin film encapsulation layer that contacts an environmental element, and that includes at least one inorganic layer including a low temperature viscosity transition (LVT) inorganic material, wherein the inorganic layer is formed using a process including forming a pre-inorganic layer including the LVT inorganic material by providing the LVT inorganic material onto the organic emission unit on which the environmental element is located, performing a first healing process on the pre-inorganic layer at a temperature greater than a viscosity transition temperature of the LVT inorganic material, and performing a second healing process on the pre-inorganic layer having undergone the first healing process to increase a binding force between the environmental element and the LVT inorganic material, and to increase a binding force among the LVT inorganic material.

The environmental element may include an impurity particle that occurs during formation of the organic emission unit.

The viscosity transition temperature of the LVT inorganic material may be a minimum temperature required to cause the LVT inorganic material to exhibit properties of fluidity.

The viscosity transition temperature of the LVT inorganic material may be less than a denaturation temperature of a material of the organic emission unit.

The viscosity transition temperature of the LVT inorganic material may be less than a minimum of denaturation temperatures of a plurality of materials of the organic emission unit.

The LVT inorganic material may include a tin oxide.

The LVT inorganic material may include at least one of phosphorus oxide, boron phosphate, tin fluoride, niobium oxide, or tungsten oxide.

The LVT inorganic material may include at least one of: SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

The LVT inorganic material may be provided using sputtering, vacuum deposition, low temperature deposition, E-beam coating, or ion plating.

The first healing process may include heat-treating the pre-inorganic layer at a temperature between the viscosity transition temperature of the LVT inorganic material and a denaturation temperature of a material of the organic emission unit.

The first healing process may include heat-treating the pre-inorganic layer at a temperature between the viscosity transition temperature of the LVT inorganic material and a minimum of denaturation temperatures of a plurality of materials of the organic emission unit.

The first healing process may include heat-treating the pre-inorganic layer at a temperature in a range of about 80° C. to about 132° C. for about 1 hour to about 3 hours.

The first healing process may occur in a vacuum or in an inert gas atmosphere.

The second healing process may include chemical treatment, plasma treatment, hot chamber treatment, wherein the chamber contains oxygen, or hot chamber treatment, wherein the chamber contains oxygen and moisture.

The second healing process may include chemical treatment, and the pre-inorganic layer having undergone the first healing process may be treated with at least one selected from the group consisting of an acidic solution, an alkaline solution, and a neutral solution.

The alkaline solution may include a nitrate.

The second healing process may include plasma treatment, and the pre-inorganic layer having undergone the first healing process may be treated with at least one of $O_2$ plasma, $N_2$ plasma, or Ar plasma in a vacuum.

The second healing process may include plasma treatment, and the pre-inorganic layer having undergone the first healing process may be treated with at least one of $O_2$ plasma, $N_2$ plasma, or Ar plasma under atmospheric pressure.

The second healing process may include exposing the pre-inorganic layer having undergone the first healing process to a chamber having an oxygen partial pressure in a range of about 2% to about 100% of a total pressure in the chamber, and a temperature in a range of about 25° C. to about 150° C.

The second healing process may include exposing the pre-inorganic layer having undergone the first healing process to a chamber having an oxygen partial pressure in a range of about 2% to about 100% of a total pressure in the chamber, a relative humidity in a range of about 10% to about 100%, and a temperature in a range of about 25° C. to about 150° C.

The thin film encapsulation layer further may include at least one organic layer including a polymer.

The organic layer may be formed by providing a curable precursor, and then curing the curable precursor.

The curable precursor may be provided using a flash evaporator.

The curable precursor may be cured using at least one of UV radiation, infrared radiation, or laser beams.

The thin film encapsulation layer may include an organic layer and an inorganic layer that are sequentially stacked on the organic emission unit.

The thin film encapsulation layer may include a first organic layer, a second organic layer, and an inorganic layer, and the first organic layer, the inorganic layer, and the second organic layer may be sequentially stacked on the organic emission unit.

The thin film encapsulation layer may include an organic layer, a first inorganic layer, and a second inorganic layer, and the first inorganic layer, the organic layer, and the second inorganic layer may be sequentially stacked on the organic emission unit.

The environmental element may be embedded in the thin film encapsulation layer.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION

Hereinafter, embodiments of the present invention will be described more fully with reference to the accompanying drawings, in which exemplary embodiments of the invention are shown. As used herein, the term "and/or" includes any and all combinations of one or more of the associated listed items. Expressions such as "at least one of," when preceding a list of elements, modify the entire list of elements and do not modify the individual elements of the list.

A method of preparing an organic light-emitting device according to an embodiment of the present invention will be described.

Figure 1A:
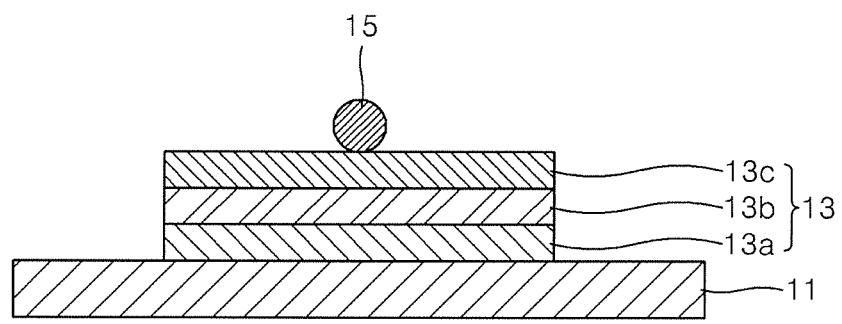
FIGS. 1A to 1D are diagrams for describing a method of preparing an organic light-emitting device according to an embodiment of the present invention.

First, as shown in FIG. 1A, an organic emission unit 13 is formed on a substrate 11. The organic emission unit 13 may have a structure in which a first electrode 13a, an organic layer 13b, and a second electrode 13c are sequentially stacked.

The substrate 11, which may be any substrate used in conventional organic light-emitting devices, such as a glass substrate or a transparent plastic substrate having excellent mechanical strength, thermal stability, transparency, surface smoothness, ease of handling, and water resistance. The substrate 11 may also be a flexible substrate that may be bent. In this regard, a bending radius of the substrate 11 may be about 10 cm or less.

The first electrode 13a may be formed by, for example, depositing or sputtering a material used to form the first electrode 13a on the substrate 11. When the first electrode 13a constitutes an anode, the material used to form the first electrode 13a may be, for example, a high work-function material to facilitate hole injection. The first electrode 13a may be a reflective electrode or a semi-transmissive electrode. Transparent and conductive materials such as, for example, indium tin oxide (ITO), indium zinc oxide (IZO), tin oxide ($SnO_2$), and zinc oxide (ZnO), may be used to form the first electrode 13a. The first electrode 13a may be formed as a reflective electrode using, for example, magnesium (Mg), aluminum (Al), aluminum-lithium (Al—Li), calcium (Ca), magnesium-indium (Mg—In), magnesium-silver (Mg—Ag), or the like.

The first electrode 13a may have a single-layered or a multi-layered structure. For example, the first electrode 13a may have a triple-layered structure of ITO/Ag/ITO, although the present invention is not limited thereto.

The organic layer 13b is formed on the first electrode 13a, and may include at least one layer selected from the group consisting of a hole injection layer, a hole transport layer, a functional layer having both hole injecting and hole transporting capabilities, a buffer layer, an electron blocking layer, an emission layer, a hole blocking layer, an electron transport layer, and an electron injection layer. For example, the organic layer 13b may include at least one of Compounds 301, 311, or 321 below.

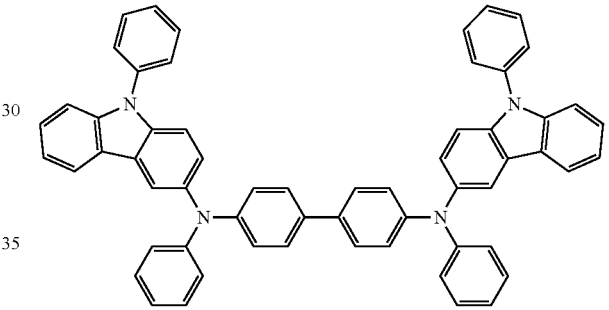

301

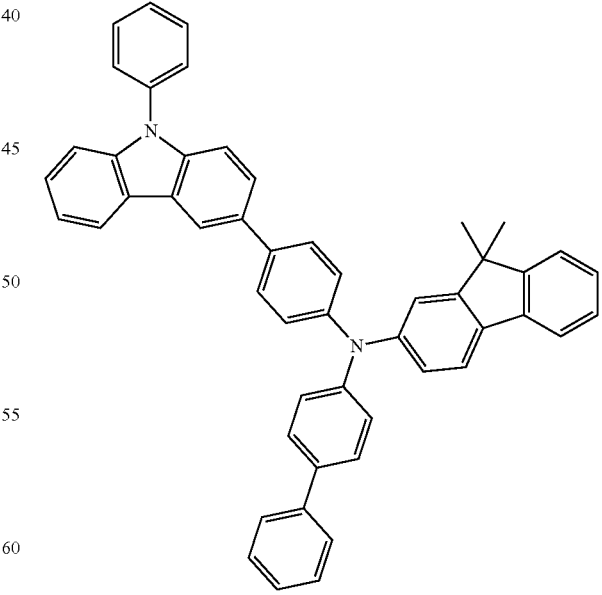

311

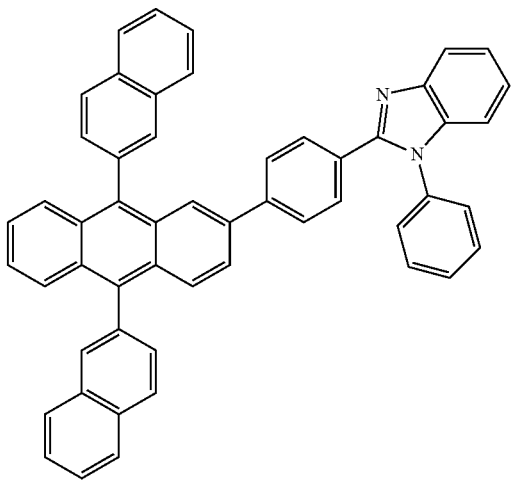

321

The second electrode 13c is formed on the organic layer 13b, and may be a cathode, which is an electron injecting electrode. A metal for forming the second electrode 13c may be, for example, a metal, an alloy, and/or an electrically conductive compound, which may have a low work function, or a mixture thereof. For example, the second electrode 13c may be a reflective, semi-transmissive, or transmissive electrode by forming a thin film using lithium (Li), magnesium (Mg), aluminum (Al), aluminum-lithium (Al—Li), calcium (Ca), magnesium-indium (Mg—In), magnesium-silver (Mg—Ag), or the like. To manufacture a top emission-type organic light-emitting device, a transmissive electrode formed of ITO or IZO may be used, and various modifications may be applied thereto.

Although not shown in FIG. 1A, the organic emission unit 13 of the present embodiment includes one pixel circuit per pixel, and the pixel circuit may include at least one thin film transistor (TFT) (not shown) and a capacitor (not shown), and the first electrode 13a may be electrically connected to the TFT.

The first electrode 13a may be patterned in each pixel independently from one another, and the second electrode 13c may be a common electrode for covering all pixels.

In a bottom emission-type organic light-emitting display device in which an image is displayed toward the substrate 11, emission efficiency toward the substrate 11 may be increased by forming the second electrode 13c to be relatively thick.

In a top emission-type organic light-emitting display device in which an image is displayed toward the organic layer 13b, the second electrode 13c may be a semi-reflective layer by forming the second electrode 13c to be relatively thin, and/or the second electrode 13b may be formed of a transparent conductive material. In the case of a top emission-type organic light-emitting display device, the first electrode 13a may further include a reflective layer.

Although not shown in FIG. 1A, a protective layer may be formed on the second electrode 13c. The protective layer may prevent or reduce damage to the second electrode 13c when a thin film encapsulation layer 20 (see FIG. 1D) is formed on the organic emission unit 13, and may be formed of, for example, LiF, lithium quinolate, $Alq_3$, or the like.

After the organic emission unit 13 is formed, an environmental element 15 commonly exists on the organic emission unit 13. The environmental element 15 is an impurity particle that is generated during the formation of the organic emission unit 13, and may be, for example, a microparticle from the external environment (e.g., dust and motes existing in the external environment), or a microparticle of a material used to form the organic emission unit 13 and remaining on the organic emission unit 13 (e.g., a microparticle of the material used to form the second electrode 13c and remaining after the second electrode 13c is formed). The environmental element 15 may include various organic materials, inorganic materials, and/or organic/inorganic compounds. The environmental element 15 cannot be easily removed using conventional methods, for example, a wet process (such as washing) after the organic emission unit 13 is formed. For example, the environmental element 15 may be a particle having an average particle diameter of about 5 μm or less, for example, in the range of about 1 μm to about 5 μm, although the present invention is not limited thereto. In FIG. 1A, the environmental element 15 is illustrated as one spherical particle, for convenience.

Figure 1B:
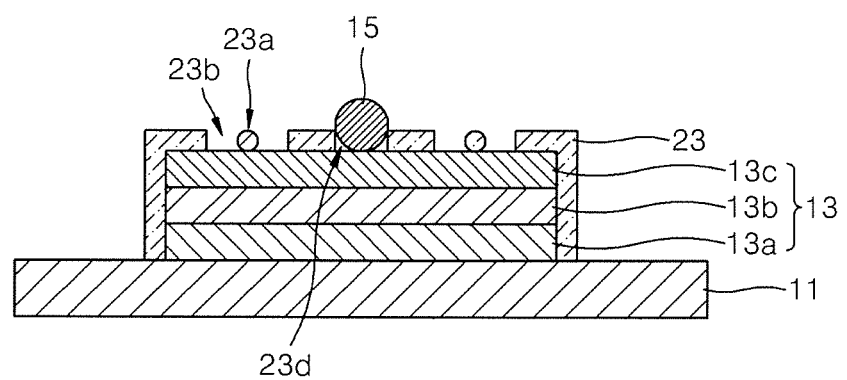

Then, according to the present embodiment, a low temperature viscosity transition (LVT) inorganic material is provided onto the organic emission unit 13 on which the environmental element 15 exists to form a pre-inorganic layer 23 including the LVT inorganic material, as shown in FIG. 1B. The LVT inorganic material is an inorganic material having a low viscosity transition temperature.

As used herein, the "viscosity transition temperature" is not a temperature where the phase of the LVT inorganic material is completely converted from a solid to a liquid, but is a minimum temperature where the LVT inorganic material has fluidity (e.g., is a fluid having a slow flow rate, or is a malleable solid).

The viscosity transition temperature of the LVT inorganic material of the present embodiment may be less than the denaturation temperature of a material contained in the organic emission unit 13 (e.g., the material of the organic emission unit 13). For example, the viscosity transition temperature of the LVT inorganic material may be less than the minimum value (e.g., the minimum) of the denaturation temperature of a material contained in the organic emission unit 13 (e.g., a lowest denaturation temperature of a plurality of materials of the organic emission unit 13).

The "denaturation temperature of the material contained in the organic emission unit 13" refers to a temperature capable of causing physical and/or chemical denaturation in a material contained in the organic emission unit 13, and the organic emission unit 13 may have a plurality, or range, of denaturation temperatures according to the type and number of materials contained therein.

For example, the "viscosity transition temperatures of the LVT inorganic material" and the "denaturation temperature of the organic emission unit 13" may indicate a glass transition temperature (Tg) of the LVT inorganic material and the organic material contained in the organic layer 13b of the organic emission unit 13. The Tg may be measured by performing thermo gravimetric analysis (TGA) on the LVT inorganic material and the organic material contained in the organic layer 13b of the organic emission unit 13.

For example, the Tg may be determined from thermal analysis of the LVT inorganic material and the material contained in the organic emission unit 13 by using TGA and differential scanning calorimetry (DSC) in an $N_2$ atmosphere at a temperature ranging from about room temperature to about 600° C. (at a rate of 10° C./min) for TGA, at a temperature ranging from about room temperature to about 400° C. for DSC (Pan Type: Pt Pan in disposable Al Pan (TGA), disposable Al pan (DSC)), and these conditions will be understood by those of ordinary skill in the art.

The denaturation temperature of the material contained in the organic emission unit 13 may be, but is not limited to, higher than about 130° C., and may efficiently be measured via TGA analysis of the material contained in the organic emission unit 13 as described above.

The minimum value of the denaturation temperatures of the material(s) contained in the organic emission unit 13 may be in the range of about 130° C. to about 140° C. The minimum value of the denaturation temperature of the material contained in the organic emission unit 13 may be, but is not limited to, about 132° C., and may efficiently be measured by measuring Tg of the material contained in the organic emission unit 13 via TGA analysis of the material as described above, and choosing the minimum Tg.

For example, the viscosity transition temperature of the LVT inorganic material may be about 80° C. or greater, for example, in the range of about 80° C. to about 132° C., in the range of about 80° C. to about 120° C., or in the range of about 100° C. to about 120° C., although the present invention is not limited thereto. For example, the viscosity transition temperature of the LVT inorganic material may be about 110° C.

The LVT inorganic material may be a single compound or a mixture of two compounds or more, and may include a tin oxide, such as SnO or $SnO_2$. When the LVT inorganic material includes SnO, the content of the SnO may be in the range of, for example, about 20% by weight to about 100% by weight. For example, the LVT inorganic material may further include at least one of phosphorus oxide (e.g., $P_2O_5$), boron phosphate ($BPO_4$), tin fluoride (e.g., $SnF_2$), niobium oxide (e.g., NbO), and tungsten oxide (e.g., $WO_3$), although the present invention is not limited thereto.

For example, the LVT inorganic material may include: SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$, although the present invention is not limited thereto.

For example, the LVT inorganic material may include the following ingredients, although the present invention is not limited thereto: SnO (100 wt %); SnO (80 wt %) and $P_2O_5$ (20 wt %); SnO (90 wt %) and $BPO_4$ (10 wt %); SnO (20-50 wt %), $SnF_2$ (30-60 wt %), and $P_2O_5$ (10-30 wt %), where the weight percent of the sum of SnO, $SnF_2$, and $P_2O_5$ is 100 wt %); SnO (20-50 wt %), $SnF_2$ (30-60 wt %), $P_2O_5$ (10-30 wt %), and NbO (1-5 wt %), where the weight percent of the sum of SnO, $SnF_2$, $P_2O_5$, and NbO is 100 wt %); or SnO (20-50 wt %), $SnF_2$ (30-60 wt %), $P_2O_5$ (10-30 wt %), and $WO_3$ (1-5 wt %), where the weight percent of the sum of SnO, $SnF_2$, $P_2O_5$, and $WO_3$ is 100 wt %).

For example, the LVT inorganic material may include SnO (42.5 wt %), $SnF_2$ (40 wt %), $P_2O_5$ (15 wt %), and $WO_3$ (2.5 wt %), although the present invention is not limited thereto.

The LVT inorganic material may be provided to the organic emission unit 13 to form the pre-inorganic layer 23 by, for example, sputtering, vacuum deposition, low temperature deposition, E-beam coating, or ion plating.

For example, the LVT inorganic material may be provided by plasma enhanced chemical vapor deposition (PECVD) or plasma-ion assisted deposition (PIAD), although the present invention is not limited thereto.

According to an embodiment of the present invention, a LVT inorganic material having a composition of SnO—$SnF_2$—$P_2O_5$—$WO_3$ may be provided to the organic emission unit 13 by sputtering. In more detail, the sputtering may be performed by using a dual rotary target method, and scanning may be performed while the substrate 11 moves. In this regard, argon plasma (12 kW and 0.4 Pa) may be used, and a desired thickness, e.g., about 1 μm, of the pre-inorganic layer 23 may be obtained by repeating the scanning a plurality of times.

As shown in FIG. 1B, the pre-inorganic layer 23 may include a defect(s) such as a film-forming element(s) 23a, a pin hole(s) 23b, and a void(s) 23d between the environmental element 15 and the organic emission unit 13.

The film-forming element 23a is a LVT inorganic material-agglomerating particle that does not contribute to the formation of the LVT inorganic material layer, and the pin hole 23b is a region at which the LVT inorganic material is not applied, and where the organic emission unit 13 is exposed. The formation of the film-forming element 23a may contribute to the formation of the pin hole 23b. The void 23d between the environmental element 15 and the organic emission unit 13 is an empty space in which the LVT inorganic material is not applied.

As described above, the defect of the pre-inorganic layer 23 may be a pathway of external environmental materials, such as moisture and oxygen, during storage or operation of the organic light-emitting device to induce the formation of a progressive dark spot, so that the lifespan of the organic light-emitting device may be reduced.

Thus, as shown in FIG. 1B, after the pre-inorganic layer 23 is formed, a first healing process that rectifies the defect of the pre-inorganic layer 23 is performed.

The first healing process may be performed at a temperature greater than the viscosity transition temperature of the LVT inorganic material. For example, the first healing process may be performed by heat-treating the pre-inorganic layer 23 at a temperature in the range between the viscosity transition temperature of the LVT inorganic material and the denaturation temperature of the material contained in the organic emission unit 13, inclusive. Alternatively, the first healing process may be performed by heat-treating the pre-inorganic layer 23 at a temperature in the range between the viscosity transition temperature of the LVT inorganic material and a minimum value of the denaturation temperatures of the material(s) contained in the organic emission unit 13, inclusive. Alternatively, the first healing process may be performed at about the viscosity transition temperature of the LVT inorganic material.

The "viscosity transition temperature of the LVT inorganic material" may vary according to the composition of the LVT inorganic material, and the "denaturation temperature of the material contained in the organic emission unit 13" and "the minimum value of the denaturation temperatures of the material contained in the organic emission unit 13" may vary according to the material(s) of the organic emission unit 13. However, these temperatures will be easily understood by those of ordinary skill in the art based upon the composition of the LVT inorganic material and the material(s) used in the organic emission unit 13, and may be determined by, for example, using a Tg evaluation obtained from TGA analysis results of the material(s) contained in the organic emission unit 13.

For example, the first healing process may be performed by heat-treating the pre-inorganic layer 23 at a temperature in the range of about 80° C. to about 132° C., for example, in the range of about 80° C. to about 120° C., or about 100° C. to about 120° C., for about 1 hour to about 3 hours, and, for example, at about 110° C. for about 2 hours, although the present invention is not limited thereto. If the first healing process is within the range described above, the LVT inorganic material of the pre-inorganic layer 23 may be fluidized (e.g., made soft or malleable), and the denaturation of the organic emission unit 13 may be reduced or prevented.

The first healing process may be performed in a vacuum or in an inert gas atmosphere, for example, in an $N_2$ atmosphere or an Ar atmosphere, and using an IR oven to prevent exposure of the organic emission unit 13 to the external environment via the pin hole 23b of the pre-inorganic layer 23.

The LVT inorganic material contained in the pre-inorganic layer 23 may be fluidized by the first healing process. The fluidized LVT inorganic material may have flowability. Thus, in the first healing process, i) the fluidized LVT inorganic material may flow and fill in the void 23d between the environmental element 15 and the organic emission unit 13,
 ii) the fluidized LVT inorganic material may flow and fill in the pin hole 23b of the pre-inorganic layer 23, and/or
 iii) the film-forming element 23a may be fluidized and flow and fill in the pin hole 23b.

Figure 1C:
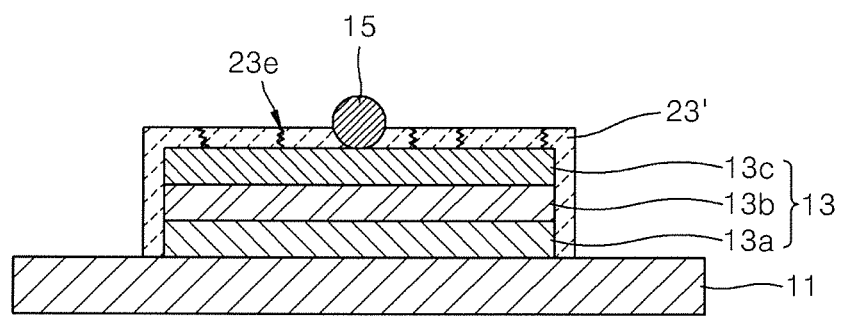

As a result, as shown in FIG. 1C, a pre-inorganic layer 23' having undergone the first healing process, or having been healed by the first healing process (e.g., a firstly healed pre-inorganic layer 23') may be formed, by which the defects of the pre-inorganic layer 23 (i.e., the film-forming element 23a, the pin hole 23b, and the void 23d between the environmental element 15 and the organic emission unit 13) may be removed.

The firstly healed pre-inorganic layer 23' may include a region(s) 23e having a weak binding force between the environmental element 15 and the LVT inorganic material, and/or having a weak binding force among the LVT inorganic materials, which may be a pathway for external environmental materials, such as moisture and oxygen, during storage or operation of the organic light-emitting device to thereby induce the formation of a progressive dark spot, so that the lifespan of the organic light-emitting device may be reduced.

Thus, a second healing process is performed to remove, or cure/improve/strengthen, the region(s) 23e having a weak binding force between the environmental element 15 and the LVT inorganic material, and having a weak binding force among the LVT inorganic materials, by accelerating vigorous substitution reaction between the environmental element 15 and the LVT inorganic material, by accelerating vigorous substitution among the LVT inorganic materials, and by improving heat resistance and mechanical strength of the firstly healed pre-inorganic layer 23'.

The second healing process may be performed using, for example, chemical treatment, plasma treatment, hot chamber treatment including oxygen, or hot chamber treatment including oxygen and moisture.

For example, the second healing process may be performed using a chemical treatment by which the firstly healed pre-inorganic layer 23' is treated with, for example, at least one of an acidic solution, an alkaline solution, and a neutral solution. In this regard, the alkaline solution may be, for example, a nitrate solution, e.g., a potassium nitrate solution.

Alternatively, the second healing process may be performed by, for example, using a plasma treatment by which the firstly healed pre-inorganic layer 23' is treated using at least one of $O_2$ plasma, $N_2$ plasma, or Ar plasma in a vacuum or under atmospheric pressure.

Alternatively, the second healing process may be performed by exposing the firstly healed pre-inorganic layer 23' to a chamber having an oxygen partial pressure in the range of about 2% to about 100% (e.g., of the total pressure), for example, an oxygen partial pressure in the atmospheric pressure, and a temperature in the range of about 25° C. to about 150° C.

Alternatively, the second healing process may be performed by, for example, exposing the firstly healed pre-inorganic layer 23' to a chamber having an oxygen partial pressure in the range of about 2% to about 100% (e.g., of the total pressure), for example, an oxygen partial pressure in the atmospheric pressure, a relative humidity in the range of about 10% to about 100%, and a temperature in the range of about 25° C. to about 150° C. The oxygen partial pressure may be a value with respect to 100% of the pressure (e.g., the total pressure) in the chamber.

Figure 1D:
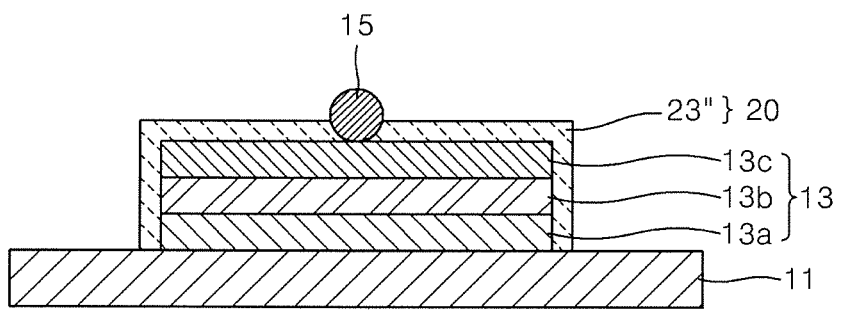

As a result, an inorganic layer (e.g., a secondly healed inorganic layer) 23" may be formed from which the region 23e having a weak binding force between the environmental element 15 and the LVT inorganic material, and having a weak binding force among the LVT inorganic materials, is strengthened, as shown in FIG. 1D. In addition, the binding force between the inorganic layer 23" and the organic emission unit 13 may be improved by the second healing process, so that a high quality organic light-emitting device may be prepared.

The surface of the inorganic layer 23" may be flat, and the thickness of the inorganic layer 23" may be in the range of about 1 μm to about 30 μm, for example, about 1 μm to about 5 μm. In this regard, if the thickness of the inorganic layer 23" is in the range of about 1 μm to about 5 μm, a flexible organic light-emitting device having increased flexibility/bending characteristics may be prepared.

The organic light-emitting device of FIG. 1D includes a thin film encapsulation layer 20 that includes (e.g., consists of) the inorganic layer 23". By performing the first and second healing processes, the inorganic layer 23" may be formed, from which the voids between the environmental element 15 and the LVT inorganic material, and the voids between the environmental element 15 and the organic emission unit 13, are removed, and in which the binding force between the environmental element 15 and the LVT inorganic material, in which the binding force among the LVT inorganic materials, and in which the binding force with the organic emission unit 13, are improved. In addition, since the inorganic layer 23" may be formed in a thin film as described above, a flexible organic light-emitting device having bending characteristics may be prepared. Accordingly, the organic light-emitting device may have long lifespan and excellent flexibility.

FIGS. 2A to 2D are diagrams for describing a method of preparing an organic light-emitting device according to another embodiment of the present invention.

Figure 2A:
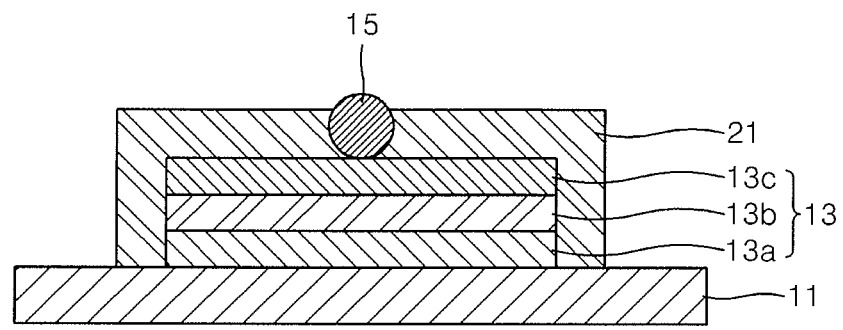
FIGS. 2A to 2D are diagrams for describing a method of preparing an organic light-emitting device according to another embodiment of the present invention.

As shown in FIG. 1A, the organic emission unit 13 is formed on the substrate 11, wherein the organic emission unit 13 includes the environmental element 15, as described with reference to FIG. 1A, and then, as shown in FIG. 2A, an organic layer 21 including a polymer is formed to cover the organic emission unit 13.

The formation of the organic layer 21 may include providing a curable precursor that can form the polymer contained in the organic layer 21, and curing the curable precursor.

The precursor may be a thermosetting or photocurable precursor having a viscosity ranging from, for example, about 5 cp to about 15 cp at room temperature, and having a boiling point ranging from, for example, about 300° C. to about 500° C. For example, the precursor may be an acrylate precursor such as monoacrylate, dimethacrylate, and triacrylate, although the present invention is not limited thereto. The curable precursor may be a single compound or a mixture of at least two different compounds. The curable precursor may be provided to the organic emission unit 13 using a flash evaporating method, although the present invention is not limited thereto.

Then, the curable precursor provided to the organic emission unit 13 is cured using a known method. For example, the precursor may be cured by using UV radiations, infrared radiations, or laser beams to form the organic layer 21, although the present invention is not limited thereto.

The thickness of the organic layer 21 may be in the range of about 1 μm to about 5 μm. If the thickness of the organic layer 21 is within the range described above, the thin film encapsulation layer 20 (see FIG. 2D) may have bending characteristics since at least one portion of the environmental element 15 that exists on the organic emission unit 13 is embedded into, or covered with, the organic layer 21.

According to an embodiment of the present invention, a curable precursor mixture including monoacrylate, dimethacrylate, and triacrylate at a weight ratio of about 2:7:1, which has a viscosity ranging from about 5 cp to about 15 cp at room temperature, and a boiling point ranging from about 300 to about 500° C., may be provided on the organic emission unit 13 using a flash evaporating method (e.g., a film-forming rate of about 200 Å/s and a film-forming time of about 3 minutes to about 4 minutes). In this regard, the curable precursor mixture is condensed to a liquid phase as soon as the curable precursor mixture is provided onto the organic emission unit 13, and thus, at least one portion of the surface of the environmental element 15 is surrounded by the curable precursor mixture without empty space between the environmental elements 15. Then, the curable precursor mixture is cured to form the organic layer 21 by using a UV curing device (e.g., a wavelength of about 390 nm and a light quantity of about 500 mJ).

Figure 2B:
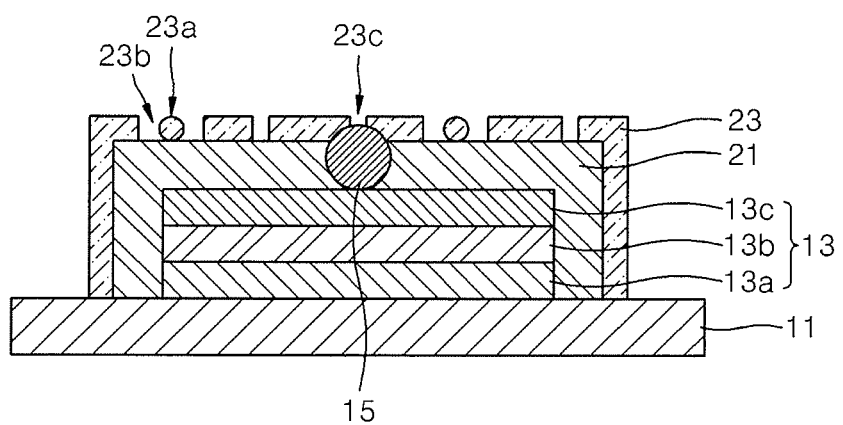

Then, the LVT inorganic material is provided to the organic layer 21 to form a pre-inorganic layer 23 including the LVT inorganic material as shown in FIG. 2B. As shown in FIG. 2B, the pre-inorganic layer 23 may include a defect such as a film-forming element(s) 23a, a pin hole(s) 23b, and a region(s) 23c through which the environmental element 15 is exposed. As described above, the above-mentioned defects of the pre-inorganic layer 23 may be enable a pathway for external environmental materials, such as moisture and oxygen, during operation or storage of the organic light-emitting device to induce the formation of a progressive dark spot, so that the lifespan of the organic light-emitting device may be reduced.

Thus, as shown in FIG. 2B, after the pre-inorganic layer 23 is formed, a first healing process that rectifies the defect(s) of the pre-inorganic layer 23 is performed. The first healing process is described above with reference to FIG. 1B.

The LVT inorganic material contained in the pre-inorganic layer 23 may be fluidized by the first healing process. The fluidized LVT inorganic material may have flowability. Thus, in the first healing process, the fluidized LVT inorganic material may flow and fill in the region 23c through which the environmental element 15 is exposed, the fluidized LVT inorganic material may flow and fill in the pin hole 23b of the pre-inorganic layer 23, and/or the film-forming element 23a may be fluidized and flow and fill in the pin hole 23b.

Figure 2C:
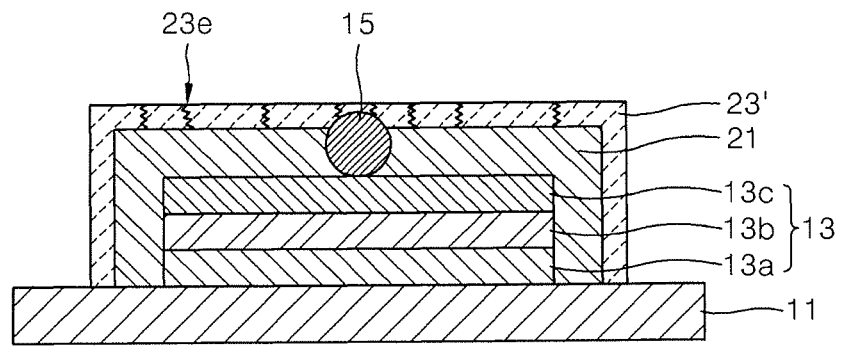

As a result, as shown in FIG. 2C, a firstly healed pre-inorganic layer 23' may be formed, from which the defects of the pre-inorganic layer 23 (i.e., the film-forming element 23a, the pin hole 23b, and the region 23c) are removed.

The firstly healed pre-inorganic layer 23' may include a region 23e having a binding force between the environmental element 15 and the LVT inorganic material, and having a binding force among the LVT inorganic materials. The region 23e having a weak binding force between the environmental element 15 and the LVT inorganic material, and having a weak binding force among the LVT inorganic materials, may be a pathway of external environmental materials (such as moisture and oxygen) during storage or operation of the organic light-emitting device to induce the formation of a progressive dark spot, so that the lifespan of the organic light-emitting device may be reduced.

Thus, a second healing process is performed to remove the region 23e having a weak binding force between the environmental element 15 and the LVT inorganic material, and having a weak binding force among the LVT inorganic materials, or to strengthen the binding force of the region. The second healing process is described above.

As a result, an inorganic layer 23" having excellent heat resistance and mechanical strength may be formed, from which the region 23e having a weak binding force between the environmental element 15 and the LVT inorganic material, and having a weak binding force among the LVT inorganic materials, is removed/eliminated. In addition, the binding force between the inorganic layer 23" and the organic layer 21 may be improved by the second healing process, so that a high quality organic light-emitting device may be prepared. The surface of the inorganic layer 23" may be flat.

Figure 2D:
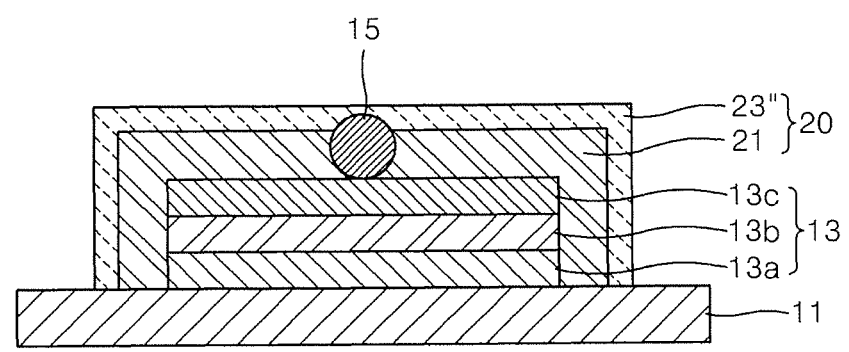

The thin film encapsulation layer 20 of FIG. 2D includes one organic layer 21 and one inorganic layer 23", and has a structure in which the organic layer 21 and the inorganic layer 23" are sequentially stacked on the organic emission unit 13. The thin film encapsulation layer 20 of FIG. 2D may considerably reduce a tack time by forming the inorganic layer 23" after forming the organic layer 21 (e.g., the organic layer 21 having a predetermined thickness), compared with the thin film encapsulation layer 20 including the inorganic layer 23" only shown in FIG. 1D, so that mass productivity (e.g., industrial production) may be improved. In addition, the thin film encapsulation layer 20 of FIG. 2D has excellent sealing characteristics due to the inorganic layer 23", and has better bending characteristics than the thin film encapsulation layer 20 of FIG. 1D including only the inorganic layer 23", since the organic layer 21 has better bending characteristics than the inorganic layer 23".

The thickness of the thin film encapsulation layer 20 of FIG. 2D may be greater than an average particle diameter of the environmental element 15. Thus, the environmental element 15 is embedded in, or covered with, the thin film encapsulation layer 20, and thus, possibility of generation of the progressive dark spot caused by exposure of the environmental element 15 may be reduced or eliminated.

Figure 3:
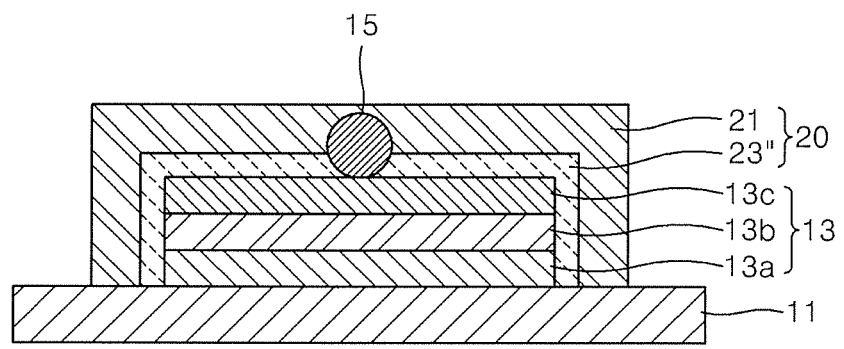
FIGS. 3 to 5 schematically illustrate organic light-emitting devices prepared according to a method of preparing the organic light-emitting device according to one or more embodiments of the present invention.

An organic light-emitting device shown in FIG. 3 has the same structure as the organic light-emitting device of FIG. 2D, except that the organic light-emitting device of FIG. 3 includes the thin film encapsulation layer 20 including one inorganic layer 23" and one organic layer 21, which are sequentially stacked on the organic emission unit 13. The organic light-emitting device of FIG. 3 is prepared in the same manner as in the preparation of the organic light-emitting device of FIG. 2D, except that the inorganic layer 23" is formed on the organic emission unit 13, and then the organic layer 21 is formed thereon.

In the thin film encapsulation layer 20 of FIG. 3, the organic layer 21 formed on the external surface of the inorganic layer 23" protects the inorganic layer 23" from external impact, and compensates for bending characteristics of the inorganic layer 23". Further, the inorganic layer 23" may provide excellent sealing characteristics for an extended period of time, as described above. Furthermore, by forming the organic layer 21, the environmental element 15 (at least one portion of which may be exposed out of the inorganic layer 23") may be completely embedded, or covered, within the thin film encapsulation layer 20. Thus, the possibility of generation of the progressive dark spot caused by exposure of the environmental element 15 may be eliminated. The thickness of the thin film encapsulation layer 20 of FIG. 3 may be greater than an average particle diameter of the environmental element 15.

Meanwhile, the organic light-emitting device may include a thin film encapsulation layer including a plurality of inorganic layers and/or a plurality of organic layers. If the thin film encapsulation layer includes a plurality of inorganic layers and/or a plurality of organic layers, the plurality of inorganic layers and/or the plurality of organic layers may be alternately stacked on each other.

Figure 4:
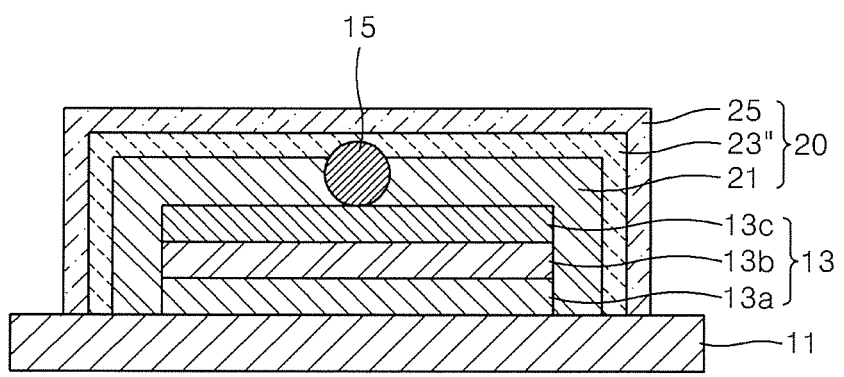

For example, an organic light-emitting device of the embodiment shown in FIG. 4 has the same structure as the organic light-emitting device of the embodiment shown in FIG. 2D, except that the organic light-emitting device of FIG. 4 includes a thin film encapsulation layer 20 that includes two organic layers (i.e., a first organic layer 21 and a second organic layer 25) and one inorganic layer 23", wherein the first organic layer 21, the inorganic layer 23", and the second organic layer 25 are sequentially stacked on the organic emission unit 13. The first organic layer 21, the second organic layer 25, and a method of preparing the same are described above with reference to FIG. 2A. The second organic layer 25 may be formed using, for example, screen printing, inkjet printing, spin coating, or the like, and various modifications can be made. The organic materials used to form the first organic layer 21 and the second organic layer 25 may be the same or different. The inorganic layer 23" and a method of preparing the same are described above with reference to FIGS. 1B, 1C, and 1D.

The first organic layer 21 and the second organic layer 25 of the thin film encapsulation layer 20 of the embodiment shown in FIG. 4 compensate for insufficient bending characteristics of the inorganic layer 23". Also, the second organic layer 25 formed on external surface of the inorganic layer 23" may protect the inorganic layer 23" from external impact. The thickness of the thin film encapsulation layer 20 of the embodiment shown in FIG. 4 may be greater than an average diameter (e.g., width or height) of the environmental element 15.

Figure 5:
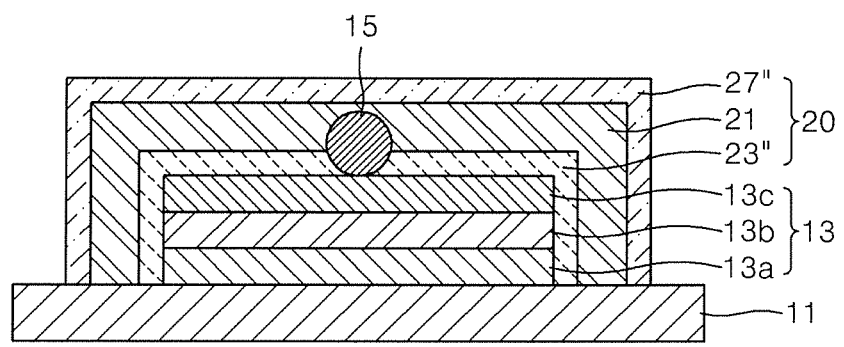

For example, an organic light-emitting device of the embodiment shown in FIG. 5 has the same structure as the organic light-emitting device of the embodiment shown in FIG. 2D, except that the organic light-emitting device of the embodiment shown in FIG. 5 includes a thin film encapsulation layer 20 that includes one organic layer 21 and two inorganic layers, i.e., a first inorganic layer 23" and a second inorganic layer 27", wherein the first inorganic layer 23", the organic layer 21, and the second inorganic layer 27" are sequentially stacked on the organic emission unit 13. The first inorganic layer 23" and the second inorganic layer 27" of the organic light-emitting device of FIG. 5, and a method of preparing the same, are described above with reference to FIGS. 1B, 1C, and 1D. The second inorganic layer 27" may also be formed of a different inorganic material from the first inorganic layer 23" such as, for example, silicon-based oxide, silicon-based nitride, aluminum-based oxide and/or aluminum-based nitride, and various modifications can be made. The organic layer 21 and a method of preparing the same are described above with reference to FIG. 2A.

The organic light-emitting devices including a thin film encapsulation layer 20 including a plurality of inorganic layers and/or a plurality of organic layers are described above with reference to FIGS. 4 and 5. However, various modifications can be made, referring to FIGS. 4 and 5. For example, the thin film encapsulation layer 20 may include the first inorganic layer, the first organic layer, the second inorganic layer, and the second organic layer, which may be sequentially stacked.

In the organic light-emitting devices of the embodiments shown in FIGS. 1A to 5, the thin film encapsulation layer 20 is formed to cover the organic emission unit 13, but the location of the thin film encapsulation layer 20 of the present embodiment is not limited thereto.

For example, the thin film encapsulation layer 20 of the embodiments shown in FIGS. 1D, 2D, 3, 4, and 5 may be formed under the substrate 11. If the substrate 11 is a TFT substrate, the TFT is sealed from the external environment by the thin film encapsulation layer 20, so that the organic light-emitting device may have long lifespan and flexibility.

For example, the thin film encapsulation layer 20 of the embodiments shown in FIGS. 1D, 2D, 3, 4, and 5 may be formed between the organic emission unit 13 and the substrate 11. Accordingly, a pixel circuit including a TFT and/or a capacitor may be formed on the thin film encapsulation layer 20.

According to the method of preparing the organic light-emitting device, a flexible organic light-emitting device having a relatively long lifespan may be prepared, since a thin film encapsulation layer having excellent sealing characteristics against elements in the external environment, and having flexibility for a long period of time, may be provided.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A method of preparing an organic light-emitting device, the method comprising:
    forming an organic emission unit on a substrate; and
    forming a thin film encapsulation layer that contacts an environmental element, and that comprises at least one inorganic layer comprising a low temperature viscosity transition (LVT) inorganic material,
    wherein the inorganic layer is formed using a process comprising:
        forming a pre-inorganic layer comprising the LVT inorganic material by providing the LVT inorganic material onto the organic emission unit on which the environmental element is located;
        performing a first healing process on the pre-inorganic layer at a temperature greater than a viscosity transition temperature of the LVT inorganic material; and
        performing a second healing process on the pre-inorganic layer having undergone the first healing process to increase a binding force between the environmental element and the LVT inorganic material, and to increase a binding force among the LVT inorganic material, the second healing process comprising chemical treatment,
    wherein the pre-inorganic layer having undergone the first healing process is treated with at least one selected from the group consisting of an acidic solution, an alkaline solution, and a neutral solution.

2. The method of claim 1, wherein the alkaline solution comprises a nitrate.

* * * * *